United States Patent [19]

Miyajima et al.

[11] 4,258,342
[45] Mar. 24, 1981

[54] ELASTIC SURFACE WAVE DEVICE

[75] Inventors: Hajime Miyajima, Sakado; Akio Nakakura, Kawagoe, both of Japan

[73] Assignee: Toko, Inc., Tokyo, Japan

[21] Appl. No.: 69,320

[22] Filed: Aug. 24, 1979

[30] Foreign Application Priority Data

Aug. 28, 1978 [JP] Japan .................. 53/116727[U]

[51] Int. Cl.³ .................. H03H 9/145; H03H 9/25; H03H 9/42; H03H 9/64
[52] U.S. Cl. ........................ 333/151; 333/154; 333/194; 333/196
[58] Field of Search ............... 333/150–155, 333/193–196; 310/313

[56] References Cited
U.S. PATENT DOCUMENTS

| | | | |
|---|---|---|---|
| 3,803,520 | 4/1974 | Bristol et al. | 333/154 |
| 3,946,342 | 3/1976 | Hartmann | 333/196 |
| 4,126,838 | 11/1978 | McCusker et al. | 333/196 X |

*Primary Examiner*—Marvin L. Nussbaum
*Attorney, Agent, or Firm*—Gerald J. Ferguson, Jr.; Joseph J. Baker

[57] ABSTRACT

An elastic surface wave device including interdigital finger electrodes comprising interdigital fingers each of which consists of a pair of divided finger elements having an equal width. The spacing between adjacent ones of the interdigital fingers is equal to the spacing between the pair of divided finger elements thereof. Importantly, at least one of the interdigital fingers is differentiated from the remainder of the interdigital fingers in respect of the distance from the center of the spacing between one of the interdigital fingers and that one of the interdigital fingers which is adjacent thereto on one side to the center of the spacing between the aforementioned one interdigital finger and that one of the interdigital fingers which is adjacent thereto on the other side. Furthermore, the interdigital finger electrode is designed such that the width of the respective finger elements is equal to the spacing therebetween. Such an interdigital finger element may be employed for one of the input and output electrodes of the device. Still furthermore, the spacing between adjacent ones of the interdigital fingers and the spacing between the pair of finger elements in the input electrode are made equal to those in the output electrode, respectively.

4 Claims, 2 Drawing Figures

ELASTIC SURFACE WAVE DEVICE

The present invention relates to an elastic surface wave device employing interdigital electrodes.

Such devices, which comprise a piezoelectric substrate and input and output electrodes provided on one surface of the substrate, have been utilized as filters, delay lines or the like by virtue of the frequency characteristics thereof.

With an elastic surface wave device, when an AC signal is impressed to the input electrode thereof, electro-mechanical conversion is effected by means of the piezoelectric properties so that the input electric signal is converted into an elastic surface wave which in turn is permitted to propagate along the substrate surface of the device, and then the elastic surface wave is converted into an output electric signal via mechanical-electric conversion effected at the output interdigital electrode.

In the aforementioned elastic surface wave device, the wavelength (frequency) of an elastic surface wave excited therein is determined depending on the distance between the centers of the spacings between adjacent interdigital fingers; hence, if the distance is made constant, then the center frequency of the device is determined in correspondence thereto. However, the actual frequency characteristics of such an elastic surface wave device include a predetermined band in the vicinity of the center frequency, and therefore, when such a device is used as a filter, the number of pairs of electrodes and the opposing length of the adjacent electrodes should be suitably chosen to achieve desired band-pass filter characteristics.

In case, however, the distance between the centers of the spacings between adjacent interdigital fingers is made constant as mentioned just above, the center frequency is fixed thereby so that difficulties are inevitably encountered not only in seeking desired frequency characteristics but also designing the electrode per se.

Furthermore, in an elastic wave device, the resultant elastic surface wave is reflected at the output electrode and thus there occurs a reflected wave which is once again reflected at the input electrode and permitted to reach the output electrode to be converted into an output signal. Such a reflected wave is called triple transient echo (TTE) which constitutes a major cause for deterioration in the frequency band pass characteristics of the device.

Accordingly, it is an object of the present invention to eliminate the aforementioned problems with the prior art elastic surface wave devices, thereby providing a novel elastic surface wave device with improved characteristics.

It is another object of the present invention to provide an improved elastic surface wave device capable of achieving any desired frequency characteristics and eliminating adverse influence of TTE.

In accordance with the present invention, an improved construction of interdigital electrode is provided, whereby the foregoing objects can be achieved.

Other objects, features and advantages of the present invention will become apparent from the ensuing description taken in conjunction with the accompanying drawings.

Figure 1:
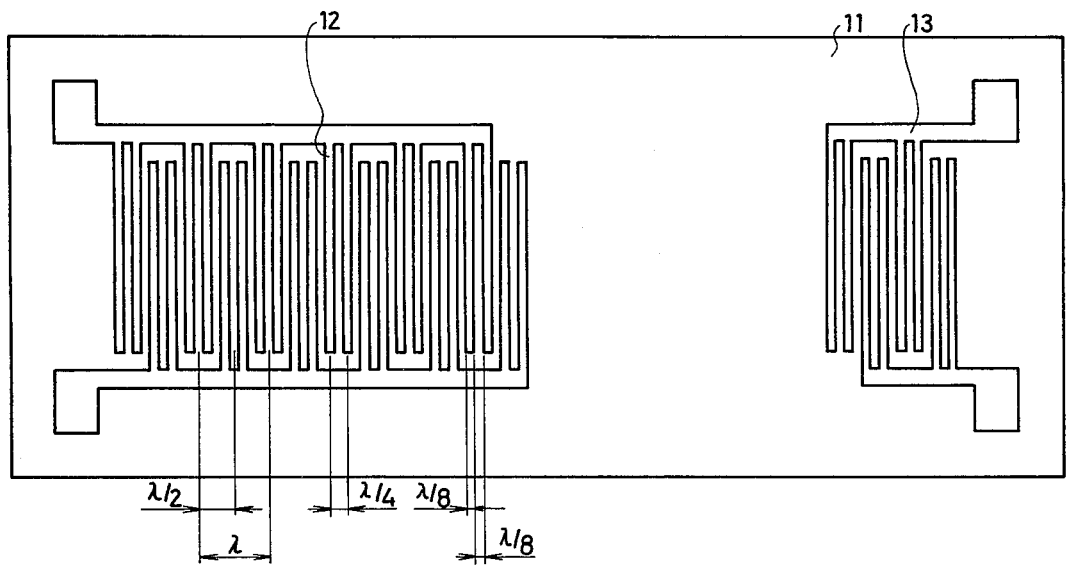
FIG. 1 is a plan view showing an elastic surface wave device of prior art.

As means for eliminating influence of TTE, use has conventionally been made of electrodes which comprise interdigital fingers each consisting of a pair of divided finger elements as shown in FIG. 1, wherein an input interdigital electrode 12 and an output interdigital electrode 13 are provided on a piezoelectric substrate 11. The respective fingers connected to an equal potential are arranged with a pitch corresponding to the wavelength $\lambda$ of elastic surface wave, and the distance between the centers of the spacings between adjacent opposing electrode fingers is set up to be equal to $\lambda/2$. Thus, the spacing between the centers of the pair of divided finger elements is equal to $\lambda/4$, and the width of one electrode finger and the spacing between adjacent fingers are equal to $\lambda/8$ respectively. With such an arrangement, elastic surface wave is partly reflected at the respective electrode fingers in such a manner that with respect to the wave reflected at one of the finger elements of a pair, the wave reflected at the other finger element of the same pair is phase-shifted by $\pm 2 \times \lambda/4 = \pm \lambda/2$. In this way, the two reflected waves are in reverse phase with each other; consequently, they are cancelled out each other so as to be prevented from appearing at the output.

In the foregoing construction, it is required that all the electrode fingers have an equal width and spacing in order that influence of TTE can be eliminated; if the spacing of one or more of the electrode fingers is varied for the purpose of improving the frequency characteristics, then it will become difficult to eliminate influence of TTE.

The present invention contemplates providing an electrode construction adapted for eliminating influence of TTE in an interdigital electrode in which one or more of the electrode fingers thereof are made different from the remainder in terms of the center-line spacing.

In summary, the interdigital electrode according to the present invention comprises interdigital fingers which are equally spaced but made different from each other in respect of width, each of the interdigital fingers consisting of a pair of finger elements having an equal width. The spacing between adjacent opposing interdigital fingers is made equal to the spacing between the pair of finger elements thereof.

Figure 2:
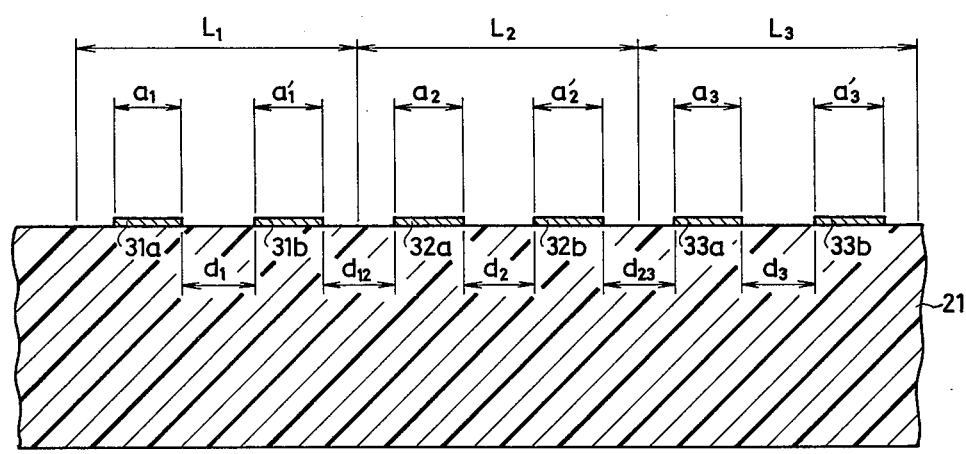
FIG. 2 is a fragmentary longitudinal sectional view showing the elastic surface wave device according to an embodiment of the present invention.

Referring now to FIG. 2, there is shown an embodiment of the present invention, wherein interdigital electrode fingers 31, 32, 33, ... are provided on a piezoelectric substrate 21. Adjacent opposing fingers such for example as 31 and 32 are electrically insulated from each other, while alternate fingers such for example as 31 and 33 are connected with each other so as to have the same potential.

In designing an electrode for an elastic surface wave device, the electrode pattern is formed based on the position where a pulse is excited and the magnitude of such a pulse, thereby achieving desired frequency characteristics. For example, in the case where use is made of a membrane such as piezoelectric thin film or the like for which an in-line model holds true, such a pulse is excited between opposing fingers and at a position which is equi-distant from or intermediate between the width-wise ends of the respective adjacent fingers. In this way, each position where a pulse is excited, is determined, and thus the fingers are arranged with such a position as the intermediate point therebetween. With such an arrangement, a pulse is excited between the respective fingers, and this constitutes an element for determining the entire frequency characteristics. The magnitude of such a pulse depends on the opposing length of the adjacent fingers.

In order to achieve desired frequency characteristics, the electrode fingers are arranged in view of the positions where a pulse is excited and the magnitude of such a pulse. In this case, however, the positions where a pulse is excited is not necessarily equi-distant from each other. That is, the spacing $L_1, L_2, L_3, \ldots$ shown in FIG. 2 are not necessarily equal to each other. In the case where $L_1, L_2, L_3, \ldots$ are not equal, the center frequencies of the elastic surface waves excited at the interdigital electrode fingers 31, 32, 33, ... will become different.

The interdigital electrode finger 31 is divided into a pair of finger elements 31a and 31b and the other fingers 32, 33, ... are also similarly divided. Letting the widths of the divided two finger elements 31a and 31b be $a_1$ and $a_1'$ respectively, the design is made such that $a_1 = a_1'$. The divided finger elements of the other fingers are also made to have an equal width.

Furthermore, letting the spacings of the divided finger elements of the interdigital electrode fingers 31, 32, 33, ... be $d_1, d_2, d_3, \ldots$, and letting the spacing between the fingers 31 and 32, the spacing between the fingers 32 and 33, ... be $d_{12}, d_{23}, \ldots$ respectively the design is also made such that $d_1 = d_{12} = d_2 = d_{23} = d_3 \ldots$ so that the respective fingers divided are equally spaced apart from each other.

When it is attempted to form such an electrode as mentioned above, the aforementioned distances $L_1, L_2, L_3, \ldots$ are first determined corresponding to the desired frequency characteristics, and then the electrode finger spacings $d_1, d_2, d_3, \ldots$ and $d_{12}, d_{23}, \ldots$ are determined, whereby the width of each electrode finger is automatically determined.

Description will next be made of the operation of the elastic surface wave device according to the present invention. Assuming that the wavelength of the elastic surface wave excited at the finger 31 of the interdigital electrode is $\lambda_1$, the following equation holds: $\lambda_1 = 2L_1$. In case the elastic surface wave having a wavelength of $\lambda_1$ is reflected as TTE at the finger 31, the wave reflected at one finger element 31b is phase-shifted by $2(a_1 + d_1)$ with respect to the wave reflected at the other finger element 31a. Since $a_1 = a_1'$ and $2(a_1 + d_1) = L_1$, the phase shift is equal to $\lambda_1/2$, whereby the TTE component having a wavelength of $\lambda_1$ is completely eliminated. In a similar manner, the TTE component of a respective wavelength is also eliminated at each of the remaining fingers.

As will be appreciated, more remarkable effect can be produced by employing the interdigital electrode for elastic surface wave device according to the present invention in combination with an interdigital electrode which has conventionally been in common use. By using as one of the input and output electrodes a uniform type interdigital electrode in which the width and spacing of the respective fingers are equal to $\frac{1}{4}$ of the wavelength corresponding to the center frequency and by employing as the other of the input and output electrodes the interdigital electrode according to the present invention, it is possible that the center-frequency TTE component is eliminated by means of the uniform type interdigital electrode while the individually excited and detected frequency components in the vicinity of the center frequency are eliminated by means of the interdigital electrode according to the present invention. In this way, according to the present invention, there is provided an elastic surface wave device in which less ripple occurs over the entire band than in the conventional elastic surface wave device which could only eliminate the center-frequency component TTE.

Furthermore, by making the finger spacing of the uniform type interdigital electrode equal to that of the interdigital electrode according to the present invention, the excited pulse amplitude per unit opposing finger length in the former electrode is made equal to that in the latter electrode so that the entire excitation efficiency of the device can be thereby enhanced. Thus, a guaranteed quantity of attenuation which substantially corresponds to the designed value can be attained at the attenuation pole.

As will be appreciated from the foregoing discussion, according to the present invention, there is provided an elastic surface wave device in which influence of TTE is eliminated so that ripple in the frequency characteristics is thereby reduced. In addition, group delay as designed can also be achieved, and the input and output impedances can be readily determined. Furthermore, influence of bulk wave can be effectively eliminated.

Although, in the foregoing, description has been made of the case where all the finger spacings are made different, the present invention is equally applicable in the case where only part of the finger spacings is made different from the remainder thereof. The interdigital electrode according to the present invention is free from any limitation in terms of freedom of design and thus can be utilized in any type of elastic surface wave device.

While this invention has been described with respect to one specific embodiment thereof, it is to be understood that the foregoing description is only exemplary of the invention and various modifications and changes may be made therein within the spirit and scope of the invention as defined in the appended claims.

What is claimed is:

1. An elastic surface wave device including interdigital finger electrode means provided on an elastic surface wave propagating medium, said interdigital finger electrode means comprising interdigital fingers each consisting of a pair of divided finger elements, said pair of divided finger elements having an equal width, the spacing between adjacent ones of said interdigital fingers being equal to the spacing between the pair of divided finger elements thereof, characterized in that at least one of said interdigital fingers is differentiated from the remainder of said interdigital fingers in respect of the distance from the center of the spacing between one of said interdigital fingers and that one of said interdigital fingers which is adjacent thereto on one side to the center of the spacing between said one interdigital finger and that one of said interdigital fingers which is adjacent thereto on the other side.

2. An elastic surface wave device according to claim 1, wherein said interdigital finger electrode means is designed such that the width of the respective finger elements is equal to the spacing therebetween, said interdigital finger electrode means being used for one of the input and output electrodes of the elastic surface wave device.

3. An elastic surface wave device according to claim 1, including an input electrode and output electrode, wherein the spacing between adjacent ones of said interdigital fingers and the spacing between the pair of finger elements thereof in the input electrode are made equal to those in the output electrode, respectively.

4. An elastic surface wave device according to claim 2, wherein the spacing between adjacent ones of said interdigital fingers and the spacing between the pair of finger elements thereof in the input electrode are made equal to those in the output electrode, respectively.

* * * * *